US008710461B2

(12) United States Patent
Kappelhof

(10) Patent No.: US 8,710,461 B2
(45) Date of Patent: Apr. 29, 2014

(54) ASSEMBLY FOR PROVIDING AN ALIGNED STACK OF TWO OR MORE MODULES AND A LITHOGRAPHY SYSTEM OR A MICROSCOPY SYSTEM COMPRISING SUCH AN ASSEMBLY

(75) Inventor: Pieter Kappelhof, Delft (NL)

(73) Assignee: Mapper Lithography IP B.V., Delft (NL)

( * ) Notice: Subject to any disclaimer, the term of this patent is extended or adjusted under 35 U.S.C. 154(b) by 0 days.

(21) Appl. No.: 13/612,498

(22) Filed: Sep. 12, 2012

(65) Prior Publication Data
US 2013/0087702 A1 Apr. 11, 2013

Related U.S. Application Data

(60) Provisional application No. 61/533,286, filed on Sep. 12, 2011.

(51) Int. Cl.
*H01J 3/14* (2006.01)
(52) U.S. Cl.
USPC .......... 250/491.1; 250/492.1; 250/492.2; 250/492.3; 359/811
(58) Field of Classification Search
USPC ......... 250/306, 440.11, 442.11, 491.1, 492.1, 250/492.2, 492.3, 522.1; 359/811
See application file for complete search history.

(56) References Cited

U.S. PATENT DOCUMENTS

| 6,122,114 A * | 9/2000 | Sudo et al. ............ 359/819 |
| 6,285,512 B1 * | 9/2001 | Sudoh ................. 359/704 |
| 6,424,473 B1 * | 7/2002 | Nakane et al. .......... 359/827 |
| 6,751,032 B2 * | 6/2004 | Nomura et al. ......... 359/819 |
| 7,009,687 B2 * | 3/2006 | Aoki .................. 355/67 |
| 7,050,148 B2 * | 5/2006 | Shiraishi .............. 355/30 |
| 7,502,183 B2 * | 3/2009 | Jao et al. .............. 359/819 |
| 7,636,209 B2 * | 12/2009 | Schletterer et al. ...... 359/819 |
| 7,729,606 B2 * | 6/2010 | Webster et al. ......... 396/144 |
| 7,863,702 B2 * | 1/2011 | Seo et al. .............. 257/432 |
| 7,971,344 B2 * | 7/2011 | Wu .................... 29/700 |
| 8,405,737 B2 * | 3/2013 | Ezawa et al. ........... 348/222.1 |
| 8,508,870 B2 * | 8/2013 | Sudoh ................. 359/820 |
| 2007/0177282 A1 | 8/2007 | Makino et al. |
| 2010/0026976 A1 * | 2/2010 | Meehan et al. ......... 355/55 |
| 2011/0279802 A1 | 11/2011 | Pnini-Mittler |
| 2012/0273691 A1 * | 11/2012 | van den Brom et al. .. 250/396 R |

FOREIGN PATENT DOCUMENTS

| DE | 10 2010 028941 | 11/2010 |
| JP | 2003-15006 | 1/2003 |

* cited by examiner

*Primary Examiner* — Michael Logie
(74) *Attorney, Agent, or Firm* — Blakely Sokoloff Taylor & Zafman

(57) ABSTRACT

The invention relates to an assembly, preferably for use in a lithography system or a microscopy system, for providing an accurately aligned stack of two or more modules in a stacking direction. Each of the two or more modules comprises three support members. The assembly comprises a frame comprising three planar alignment surfaces which extend in the stacking direction and which are angularly off-set with respect to each other. In addition each of the three support members of each one of the two or more modules, when arranged in said frame, abuts against a corresponding one of the three alignment surfaces. The frame is provided with an opening between two of the three planar alignment surfaces for inserting a module in the assembly, said two planar alignment surfaces on either side of the opening are arranged at least partially facing said opening.

28 Claims, 9 Drawing Sheets

-- PRIOR ART --

ASSEMBLY FOR PROVIDING AN ALIGNED STACK OF TWO OR MORE MODULES AND A LITHOGRAPHY SYSTEM OR A MICROSCOPY SYSTEM COMPRISING SUCH AN ASSEMBLY

This is a non-provisional application claiming the benefit of U.S. Provisional Application No. 61/533,286, filed Sep. 12, 2011.

BACKGROUND

The invention relates to an assembly for providing an aligned stack of two or more modules in a stacking direction, and to a lithography system or a microscopy system comprising such an assembly.

In particular in a lithography system or a microscopy system, various functional elements are combined in order to project one or more beams emitted from a beam source onto a target. For example, a maskless charged particle lithography system, as disclosed in WO 2011/043668, comprises a charged particle optical column for focusing one or more beams onto a surface of a target. Said charged particle optical column comprises a charged particle beam source, a collimator lens, an aperture array, an array of condenser lenses, a beam blanker array, a beam stop array, a deflector unit and a projection lens array. All these functional elements are arranged in said charged particle optical column and need to be accurately aligned with respect to each other.

When building the lithography system or the microscopy system, the various functional elements are mounted in a frame. Although the accurate alignment of the functional elements with respect to each other provides a challenge on its own, this alignment should in addition at least substantially be impervious to thermal expansion or contraction of the functional elements and/or the frame.

It is an object of the present invention to provide a lithography or a microscopy system wherein the functional elements are arranged in two or more individual modules, which modules are arranged in a stack with high accuracy and preferably wherein the alignment of the functional elements is at least substantially independent from temperature variations.

SUMMARY OF THE INVENTION

According to a first aspect, the invention provides an assembly for providing an aligned stack of two or more modules in a stacking direction, wherein each of the two or more modules comprises three support members, wherein the assembly comprises a frame comprising three planar alignment surfaces which extend in the stacking direction and which are angularly off-set with respect to each other, wherein each of the three support members of each one of the two or more modules, when arranged in said frame, abuts against a corresponding one of the three alignment surfaces, and wherein the frame is provided with an opening between two of the three planar alignment surfaces for inserting a module in the assembly, said two planar alignment surfaces on either side of the opening are arranged at least partially facing said opening.

According to the invention each module is supported by three support members, which provides a stable support of the module. In addition the orientation of each module in the stack is controlled by the abutment of each of the three support member against the corresponding planar alignment surface. In particular, because the orientation of the two or more modules in the stack is controlled same three planar alignment surfaces, the two or more modules can be arranged in the stack with high accuracy and high reproducibility.

The frame is provided with an opening between two of the three plane alignment surfaces for inserting the two or more modules in the assembly. Each one of the two or more modules can thus be inserted in and removed from the frame via the opening. Because the opening is arranged between two of the three planar alignment surfaces for one of the two or more modules, which three planar alignment surfaces are preferably arranged to intersect a first plane which is at least substantially perpendicular to the stacking direction, a module is inserted or removed by moving it at least substantially parallel to the first plane. The modules are thus inserted or removed in a direction at least substantially different from, preferably perpendicular to, the stacking direction. In particular the opening is an insert opening which extends in a direction substantially parallel to the stacking direction, and between said two of the three planar alignment surfaces.

Said two planar alignment surfaces on either side of the opening are arranged at least partially facing said opening. Within the context of this patent application, this means that the two planar alignment surfaces can at least partially be viewed from the opening. The term 'at least partially facing' means that the alignment surfaces may be arranged at an angle of 90 degrees or less with respect to a viewing direction from the opening.

In an embodiment, the three alignment surfaces extend in a corresponding plane, and wherein the corresponding planes of the three planar alignment surfaces intersect in an intersecting line, which intersecting line extends in the stacking direction. Since each of the support members of a module abuts its corresponding alignment surface, any expansion or contraction of a module due to changes in temperature results in a shift of the support member along its corresponding alignment surface. The intersecting line defines a thermal centre line of the stack. The position of this thermal centre line is at least substantially independent from temperature variations. Thus, by arranging the functional elements at or near the thermal centre line, the position of the functional elements is at least substantially independent from temperature variations.

In an embodiment, all alignment surfaces for two or more modules extend each in a corresponding plane, and wherein the corresponding planes of all alignment surfaces at least substantially intersect in one intersecting line, which intersecting line extends in the stacking direction. In this embodiment the thermal centre line of each of the tow or more modules is arranged on the one intersecting line. Thus, arranging the functional elements of each module at or near the thermal centreline, provides a stack of functional elements which is at least substantially independent from temperature variations. Such a stack may for example comprise an optical column for a microscope or a lithography device, or a charge particle optical column for an electron microscope or a charged particle beam lithography device.

In a further embodiment the alignment surfaces for said two or more modules which are arranged at the same side of the opening are surfaces on a single alignment element. Such an alignment element comprises, for example, a monolithic alignment block which is connected to the frame. In an embodiment the monolithic alignment block is made from a hard material, such as titanium, and preferably the alignment surfaces are provided with a diamond like coating. In an embodiment, each of the three planar alignment surfaces for aligning all modules of said stack of two or more modules in the stacking direction, is a side-surface of the monolithic alignment block.

In an alternative embodiment, the alignment surfaces for said two or more modules which are arranged at the same side of the opening are surfaces of individual alignment elements. Such an individual alignment element comprises, for example, a thin plate made from a hard material, such as such as titanium, and preferably the alignment surfaces are provided with a diamond like coating. Each of the thin plates is connect at the proper position to a precisely machined part of the frame.

In an embodiment, said assembly further comprising a pre-load member for applying a force on at least one of the two or more modules for pushing the three support members of the at least one of the two or more modules against the corresponding one of the three alignment surfaces. The pre-load member is arranged to at least substantially ensure the abutment of the support members against the corresponding alignment surfaces, and thus to ensure the accurate alignment of the modules in the stack.

In an embodiment, said frame further comprises three support surfaces arranged in a first plane for supporting the support members of a first module of said two or more modules, and wherein the frame comprises three support surfaces arranged in a second plane for supporting the support members of a second module of said two or more modules, wherein the second plane is at least substantially parallel to the first plane. The support surfaces inter alia define the position of the modules in the stack direction. The combination of the alignment surfaces and the support surfaces provides an accurate position and orientation of the modules in the stack in respect with each other.

In an embodiment, the first and second planes extend at least substantially perpendicular to the stacking direction. In this embodiment, the abutment of the three support members against the three alignment surfaces determine the position of the module in the plane perpendicular to the stacking direction, and the orientation with respect to a rotation around the stacking direction. In addition, the abutment of the three support members on the support surfaces determine the position of the modules along the stack direction and the orientation with respect to a rotation around an axis perpendicular to the stacking direction.

In an embodiment, each of the three support surfaces for supporting the support members of a first module are arranged adjacent to one of the three planar alignment surfaces. This allows for a relatively small support member to abut at the same time against an alignment surface and an adjacent support surface.

In an embodiment, the three support surfaces for supporting the support members of the second module are arranged above the three support surfaces for supporting the support members of the first module. Each module of this embodiment can be supported at its own level in the frame.

In an embodiment, the three support members of the second module are arranged at least substantially outside a triangle defined by the three support members of the first module. At least in the stack direction, the position of the support members for the second module do not overlap with the position of the support members for the first module, which at least substantially prevents an interference or obstruction when positioning the first and/or second module.

In an embodiment, the support surfaces for said two or more modules which are arranged at the same side of the opening are surfaces on a single support element. Such a single support element comprises, for example, a monolithic support block which is connected to the frame. The monolithic supporting block is preferably made from a hard material, such as titanium, and the support surfaces preferably are provided with a diamond like coating. In an embodiment, each of the three support surfaces for aligning all modules of said stack of two or more modules in the stacking direction, is a top-surface of a ridge in the monolithic support block.

In an alternative embodiment, the support surfaces for said two or more modules which are arranged at the same side of the opening are surfaces of individual support elements. Such an individual support element comprises, for example, a thin plate made from a hard material, such as such as titanium, and preferably the alignment surfaces are provided with a diamond like coating. Each of the thin plates is connect at the proper position to a precisely machined part of the frame, preferably on top of a precisely machined ridge of the frame.

In an embodiment, at least one of said support members of the two or more modules is a ball, preferably wherein each support member is a ball.

In an embodiment, each of the three planar alignment surfaces is arranged in an at least substantially vertical plane, wherein said vertical planes intersect in an at least substantially vertical intersecting line which intersecting line defines the thermal centre of the aligned stack.

In an embodiment, the assembly comprises rails for supporting and guiding at least one of the two or modules during an insertion thereof in the assembly, wherein the rails are arranged such that an inserted module is free from said rail. When inserting a module, said module is supported and guided by rails for the convenience of the operator and for directing said module towards the correct position in the stack. However, when the module is at the correct position, said module is only supported by its support members on the support surfaces and against the alignment surfaces, and said module is free from the rails.

In an embodiment, each of the three planar alignment surfaces is arranged on a ridge. This embodiment thus comprises three ridges, wherein each of said ridges provides a stop surface for a corresponding support member of the modules. Such a ridge can be machined with a much higher accuracy than a whole alignment surface, and therefore provides a higher accuracy of the alignment of the modules in the stack.

In an embodiment, said ridge is an at least substantially straight ridge. In an embodiment said ridges extend in the stacking direction, and said ridges preferably also recede from each other in the stacking direction.

In an embodiment, the frame further comprises a front guideway, wherein the front guideway extends from a position between the two of the three planar alignment surfaces in a direction facing away from the third planer alignment surface. The front guideway is arranged for guiding one of the two or more modules when it is move in or out of the frame.

In a further embodiment, the assembly comprises a pre-load member, which in use is movably in the frame, in particular at the front guideway thereof, wherein the pre-load member is arranged for pushing the three support members of said one of the two or more modules against a corresponding one of the three planar alignment surfaces. In an embodiment the pre-load member is arranged for, in use, delivering a force on one of the three support members of said one of the two or more modules for pushing all three support members of said one of the two or more modules against a corresponding one of the three planar alignment surfaces. In an embodiment, the frame is provided with a closing member which, at least when at least substantially arranged in a position for closing of an insert opening of the front guideway, pushes the pre-load member towards said one of the two or more modules. Preferably, the closing member comprises a spring. In an embodiment, the pre-load member is provided with wheels which are guided in the frame, to provide a substantially freely moving of the pre-load member along the front guideway.

According to a second aspect, the invention provides a lithography system comprising an assembly as described above.

In an embodiment, said lithography system comprising:
a first module comprising a source for one or more charged particle beams,
a second module comprising a deflector for said one or more charged particle beams, and
a third module comprising a projection lens for projecting said one or more charged particle beams onto a target,
wherein the first, second and third modules are inserted in the assembly to provide accurately aligned stack of said modules.

In an embodiment, the source, the deflector and the projection lens are arranged at least substantially at or near the thermal centre of the aligned stack.

According to a third aspect, the invention provides a microscopy system comprising an assembly as described above.

In an embodiment, said microscopy system comprising:
a first module comprising a source for one or more electron beams,
a second module comprising electron-optical elements for manipulating said one or more electron beams, and
a third module comprising a projection lens for projecting said one or more electron beams onto a target,
wherein the first, second and third modules are inserted in the assembly to provide accurately aligned stack of said modules.

The various aspects and features described and shown in the specification can be applied, individually, wherever possible. These individual aspects, in particular the aspects and features described in the attached dependent claims, can be made subject of divisional patent applications.

BRIEF DESCRIPTION OF THE DRAWINGS

The invention will be elucidated on the basis of an exemplary embodiment shown in the attached drawings, in which.

DETAILED DESCRIPTION OF THE INVENTION

Figure 1:
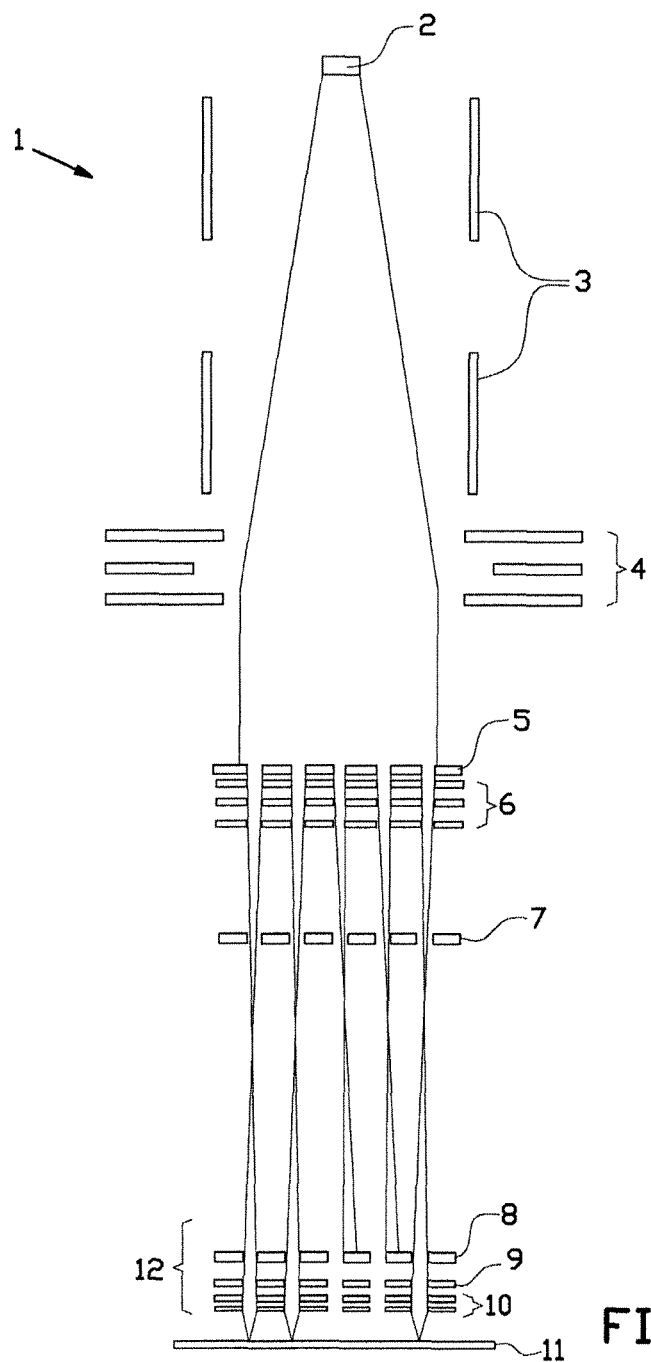
FIG. 1 shows a schematic diagram of a prior art charged particle exposure system.
Figure 2:
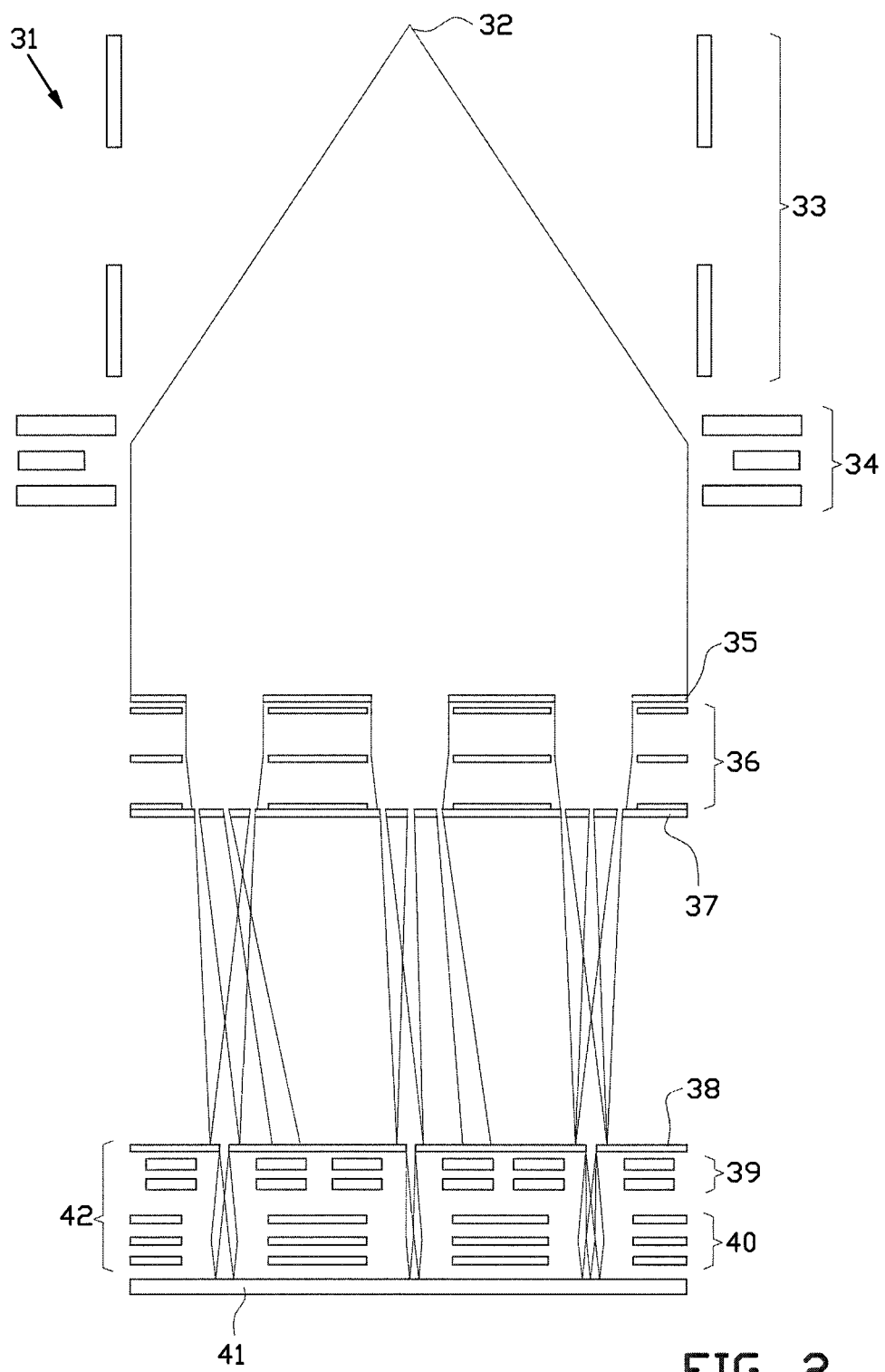
FIG. 2 shows a schematic diagram of an alternative charged particle exposure system.

An optical column 1 for a maskless charged particle lithography system is shown in FIG. 1A. Said optical column 1 comprises various functional elements, which are described below. The optical column 1 inter alia comprises a charged particle beam source 2 for emitting a charged particle beam which traverses a double octopole 3 and collimator lens 4 before impinging on an aperture array 5. The aperture array then splits the beam into a multitude of charged particle beamlets which traverse a condenser array 6. At beam blanker array 7 individual beamlets may be blanked, i.e. may be deflected such that they encounter beam stop array 8 later on in their trajectories instead of passing through apertures in beam stop array 8. The beamlets that have not been blanked then pass through a deflector unit 9 which is adapted to provide a scanning deflection of said beamlets over the surface of a target 11. At the end of their trajectories the beamlets that have not been blanked pass through a lens array 10 adapted for focusing said beamlets onto a surface of a target 11. The various functional elements of the optical column 1 need to be arranged in a stack with high accuracy and preferably wherein the alignment of the functional elements is at least substantially independent from temperature variations.

FIG. 1B shows an alternative optical column 31. A charged particle beam source 32 emits a charged particle beam which traverses a double octopole 33 and collimator lens 34 before impinging on an aperture array 35. The aperture array then splits the beam into a plurality of charged particle subbeams which traverse a condenser array 36. At beam blanker array 37 the subbeams are split into a multitude of beamlets. The individual beamlets may be blanked, i.e. may be deflected such that they encounter beam stop array 38 later on in their trajectories instead of passing through apertures in beam stop array 38. The beamlets that have not been blanked then pass through a deflector unit 39 which is adapted to provide a scanning deflection of said beamlets over the surface of a target 41. At the end of their trajectories the beamlets that have not been blanked pass through a lens array 40 adapted for focusing said beamlets onto a surface of a target 41. Again, the various functional elements of the optical column 31 need to be arranged in a stack with high accuracy and preferably wherein the alignment of the functional elements is at least substantially independent from temperature variations.

Figure 3:
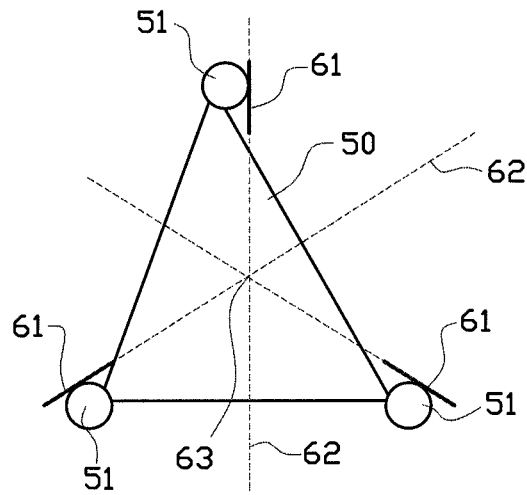
FIG. 3 shows a schematic top view of the thermal stable positioning of a module.

FIG. 3 schematically shows a top view of a thermal stable positioning of a module 50 in a frame. The module 5 is provided with three at least substantially spherical support members 51. The frame, which will be described in more detail below, comprises three planar alignment surfaces 61, which are angularly off-set with respect to each other. When arranged in the frame, each of the three support members 51 of the module 50 lies alongside against a corresponding one of the three alignment surfaces 61. To ensure that the support members stay in contact with the corresponding alignment surfaces 61, a force may be applied on said module in order to push the support members 51 against the alignment surfaces 61.

Each one of the three alignment surfaces 61 extends in a corresponding plane 62, wherein the corresponding planes 62 of the three planar alignment surfaces 61 intersect in one intersecting point 63. This intersecting point 63 is at least substantially arranged in the middle of the module 5. When the module 5 or the frame experiences an extension or contraction, for example due to changes in temperature, the spherical support members 51 will slide along the alignment surfaces 61. However, the position of the intersecting point 63 will not change. Thus the intersecting point 63 provides a thermal centre. Arranging the functional elements at or near the intersecting point 63 or thermal centre, makes the alignment of the functional elements at least substantially independent from thermal expansion or contraction of the modules and/or the frame.

Figure 4:
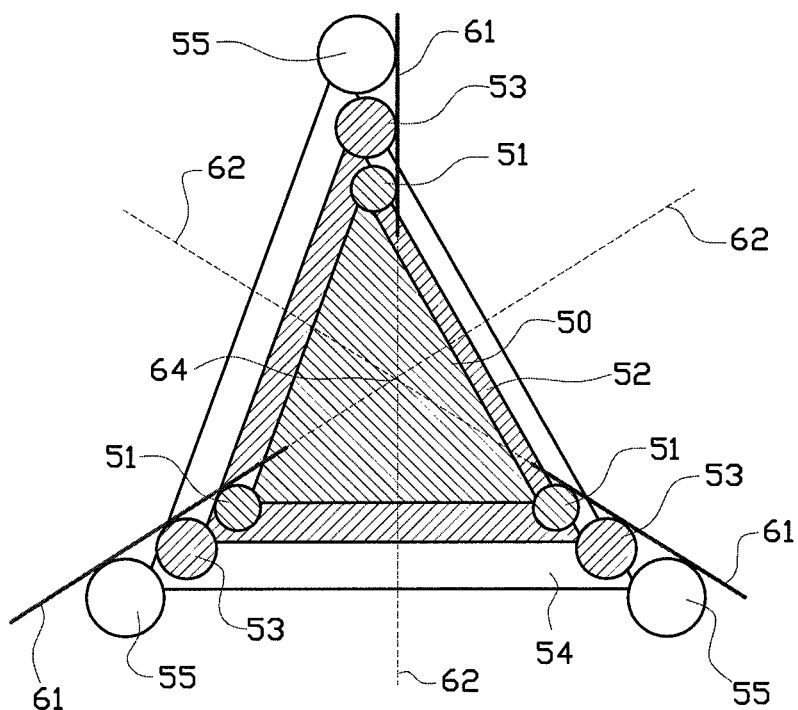
FIG. 4 shows a schematic bottom view of three modules on top of each other.

According to the invention, this same principle is applied in a stack as shown in FIG. 4. FIG. 4 shows an assembly for providing an accurately aligned stack of two or more modules 50, 52, 54, in a stacking direction which is substantially along the viewing direction.

In this example each of the three modules 50, 52, 54, comprises three support members 51, 53, 55. When arranged in the frame, each of the three support members 51, 53, 55 of the modules 50, 52, 54 lies alongside against a corresponding one of the three alignment surfaces 61. Since each one of the alignment surfaces 61 acts as a stop surface of one of the support members 51, 53, 55 of each module 50, 52, 54, the thermal centers 64 of each of the modules 50, 52, 54 are accurately arranged on top of each other in the stacking direction.

Furthermore, as shown in FIG. 4, the spherical support members 51, 53, 55 can be of different size. In particular, the diameter of the spherical support members 51 of the lowest module 50 is smaller than the diameter of the spherical support members 53 of the second module 52, which is arranged above the lowest module 50, and the diameter of the spherical support members 53 of the second module 52 is smaller than the diameter of the spherical support members 55 of the third module 54, which is arranged above the second module 52.

As also shown in FIG. 4, the three support members 53 of the second module 52 are arranged at least substantially outside a triangle defined by support members 51 of the first module 50, and the three support members 55 of the third module 54 are arranged at least substantially outside a triangle defined by support members 53 of the second module 52.

Figure 5:
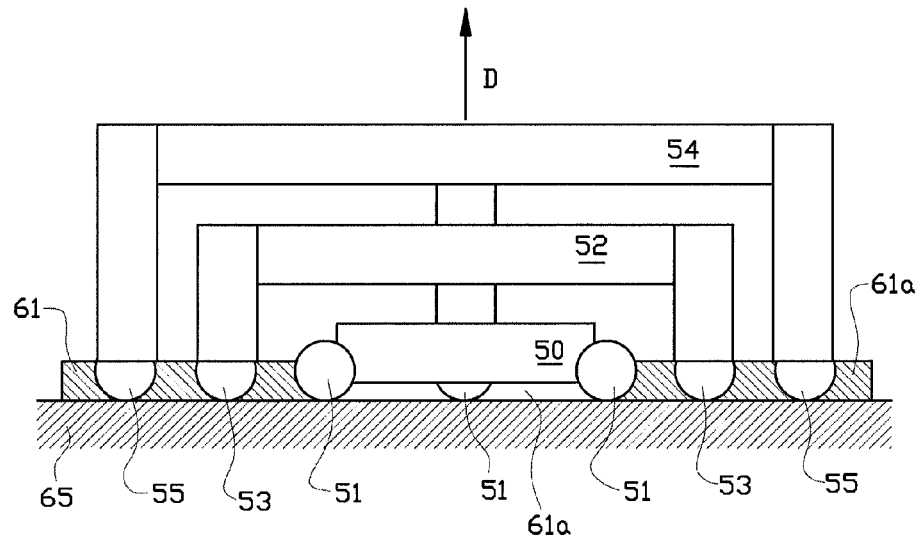
FIG. 5 shows a side view of a first embodiment of the three modules of FIG. 4.

In a first exemplary embodiment as shown in FIG. 5, the frame comprising three planer alignment surfaces 61*a* which extend in the stacking direction D. In addition, the frame comprises support surfaces arranged in a first plane 65 for supporting the support members 51, 53, 55 of three modules 50, 52, 54. Although this embodiment provides an assembly for arranging modules 50, 52, 54 in a stack with high accuracy and wherein the alignment of the functional elements, when arranged in or near the thermal centers 64, is at least substantially independent from temperature variations, the schematic side view of FIG. 5 shows that the second module 52 reaches over the first module 50, and the third module 54 reaches over the second module 52.

Actually it would be beneficial when every one of the modules 50, 52, 54 can be inserted from a front side of the assembly, for example substantially along the viewing direction of FIG. 5. In view of this, it is noted that in the first exemplary embodiment, it is necessary to remove the first module 50 before the second module 52 can be removed, and it is necessary to remove both the first module 50 and the second module 52 before the third module 54 can be removed.

Figure 6:
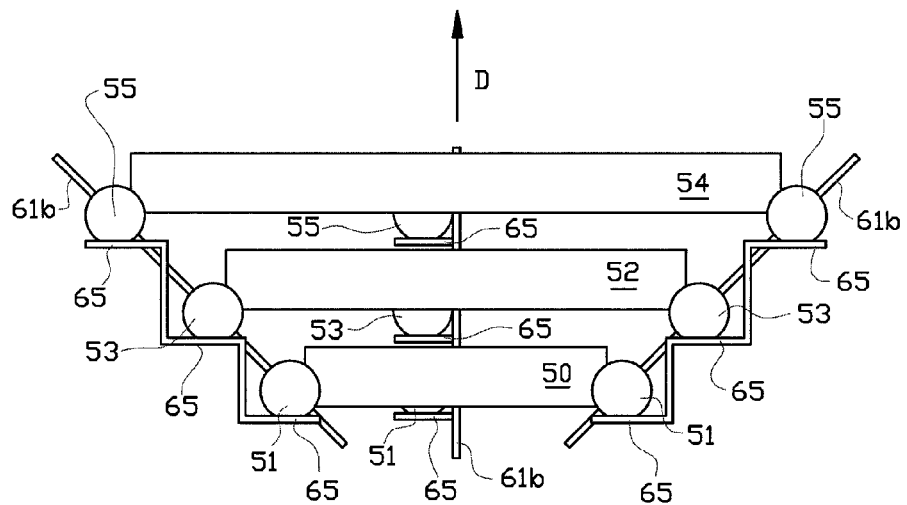
FIG. 6 shows a side view of a second embodiment of the three modules of FIG. 4.

In a second exemplary embodiment as shown in FIG. 6, the frame comprising three planer alignment surfaces which are arranged on a ridge 61*b* extends in the stacking direction D, and which recede from each other in the stacking direction D. In addition, the frame comprises support surfaces 65 which are arranged in the different levels supporting the support members 51, 53, 55 of three modules 50, 52, 54 each on its corresponding level. In particular this embodiment three stair-shaped support surfaces 65 for supporting the support member 51, 53, 55 of the modules 50, 52, 54 at their corresponding level. This arrangement as shown in FIG. 6, makes it possible that every module 50, 52, 54 can be inserted or removed from the front side of the assembly, thus substantially along the viewing direction of FIG. 6.

As further shown in FIG. 6, the three support surfaces 65 for supporting the support members 53 of the second module 52 are arranged above the three support surfaces 65 for supporting the support members 51 of the firs module 50.

Figure 7:
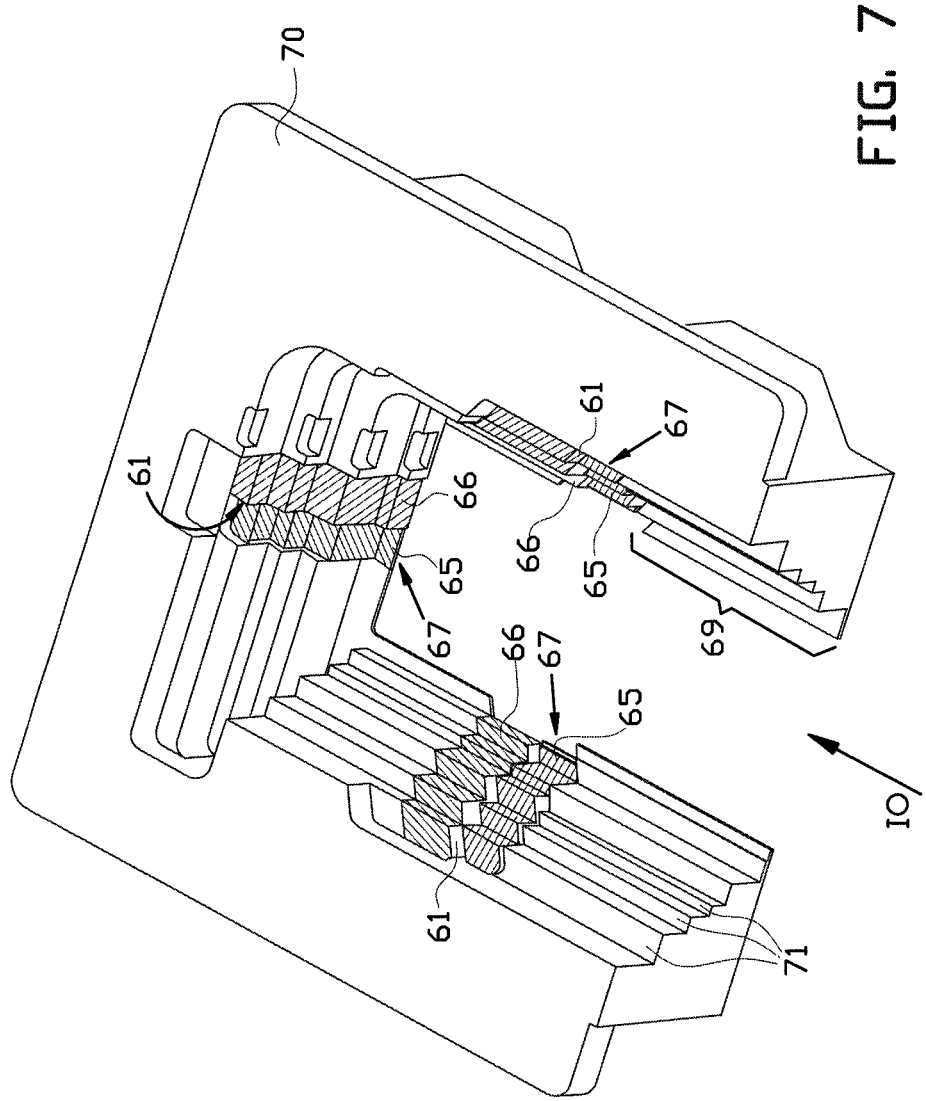
FIG. 7 shows a schematic view of a frame for arranging the modules as shown schematically in FIG. 6.

FIG. 7 shows a frame 70 for the second exemplary embodiment as shown in FIG. 6. The frame 70 is substantially U-shaped, and is provided with inserts 66, 67 which provide the alignment surfaces 61 and the support surfaces 65. The frame 70 can be made from an easy to machine material, for example aluminum. Each of the three plane alignment surfaces 61 for aligning all modules of said stack, is a side-surface of a monolithic alignment block 66 which is inserted in the frame 70. The monolithic alignment blocks 66 are made from a hard material, such as titanium, and the alignment surface 61 preferably is provided with a diamond like coating.

Alternatively the side-surfaces 61 may be provided with a ridge 61*b*, as shown in FIG. 6, wherein the side of the ridge 61*b* facing the spherical support members 51, 53, 55 then acts as the planar alignment surface.

Also the support surfaces 65, which are adjacent to one of the three plane alignment surfaces 61, are arranged in a monolithic support block 67, which is connected to the frame 70. The monolithic supporting block 67 is also made from a hard material, such as titanium, and the support surfaces 65 preferably are provided with a diamond like coating.

As shown in FIG. 7, The frame 70 is provided with an opening IO between two of the three plane alignment surfaces 61 for moving the modules in or out of the assembly along the insert direction R. The frame 70 further comprises a front guideway 69 for guiding one of the two or more modules when inserted in the assembly. The front guideway 69 extends from a position between the two of the three planar alignment surfaces 61 towards the insert opening IO, thus in a direction facing away from the third planer alignment surface 61 which is arranged at a part of the frame opposite to the insert opening IO.

Figure 8:
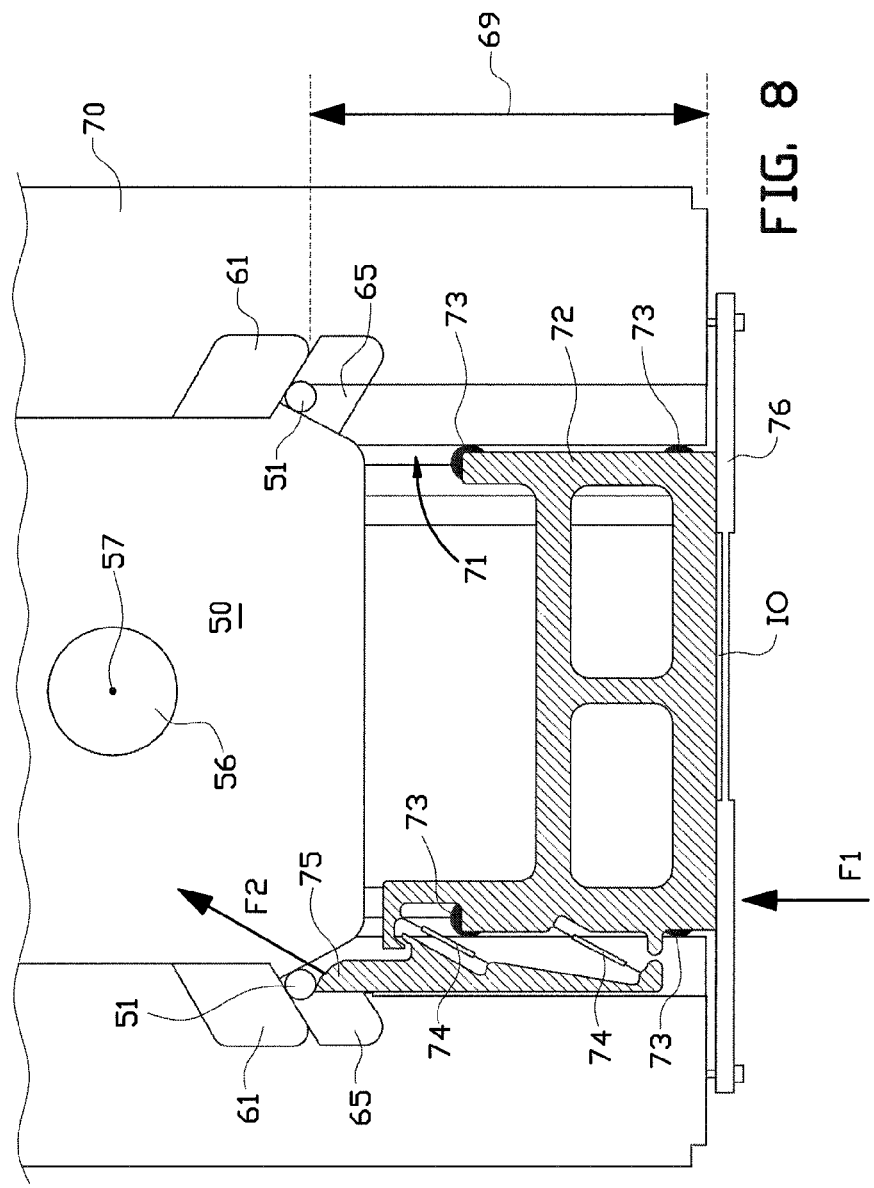
FIG. 8 shows a module arranged in the frame of FIG. 7, which is further provided with a pre-load member for applying a force on said module, FIG. 9 schematically shows the rails for supporting and guiding a module during an insertion thereof in the frame, FIG. 10 A schematically shows the module during the insertion, FIG. 10 B schematically shows the module at the correct position in the stack and being free from the rails.

FIG. 8 shows the arrangement of a module 50 in the frame 70. As shown in FIG. 8, a pre-load member 72 is provided for applying a force F2 on the module 50, in particular on one of the support members 51 of the module 50, for pushing the three support members 51 of the module against the corresponding one of the three alignment surfaces 61. The pre-load member 72 is movably arranged in the frame 70, in particular at the front guideway 69 thereof, and is provided with wheels 73 which are guided by stair-shaped 71 recesses in the frame, to be able to freely move along the insert direction R.

In order to apply the force F2 on the module 50, so it remains in its place and to make sure that the force F2 on the module is applied in the correct direction, the pre-load member 72 is provided with a load bar 75, which is connected to the pre-load member 72 via two flexures 74 which at least substantially extend in a direction parallel to the correct direction of the applied force F2. In addition the load bar 75 is arranged to push against the spherical support member 51 at a position of the spherical support member 51 which faces away from the module 50. Due to this particular designed pre-load member 72 with the load bar 75, an applied normal force F1 in the insert direction results is a force F2 on the spherical support member 51, which force F2 is at a sharp angle with respect to the normal force F1. The result is a correct force F2 on one of the spherical support members 51 of the module 50 for pushing all three support members 51 of the module 50 against the corresponding one of the three alignment surfaces 61, when a normal force F1 is applied on the preload member 72. This normal force F1 is provided by a spring 76, which is connected to the frame 70 and which spring 76 also closes the insert opening IO for a module in the frame 70.

The angular off-set of the alignment surfaces 61 and/or the position of the support member 51 are arranged in order to provide abutment of all three of the support members 51 against all three alignment surfaces 61, just by applying the force F2 on only one of the three support member 51.

In addition, the module 50 is provided with one or more functional elements 56, such as a beam source and/or manipulation devices, for example a deflector and/or lenses, for manipulating a beam when emitted from said beam source. These functional elements 56 are arranged in and/or on the module 50, in such a way that when the module 50 is inserted in the frame 70, and the support members 51 of the module 50 is arranged against the alignment surfaces 61, a centre line and/or optical axis 57 of said functional elements 56 at least substantially coincides with the thermal centre of the aligned stack.

Preferably each module 50, 52, 54 when arranged in the frame 70 is provided with its won pre-load member.

Figure 9:
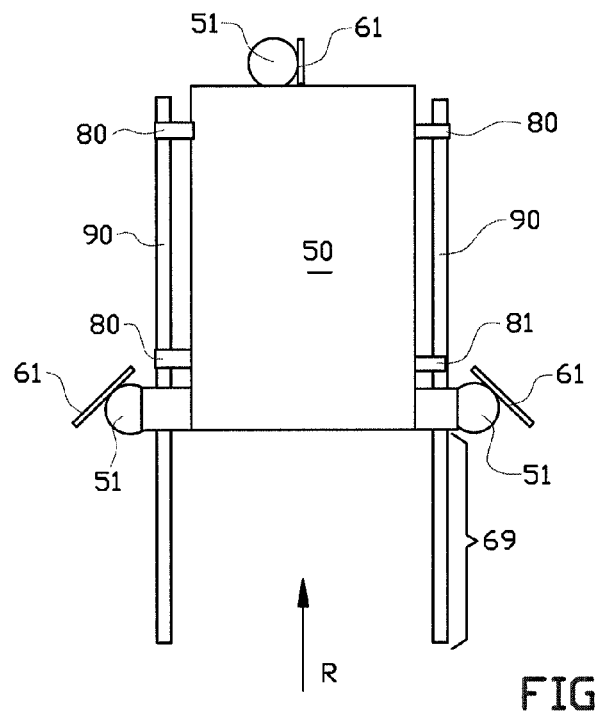
Figure 10A:
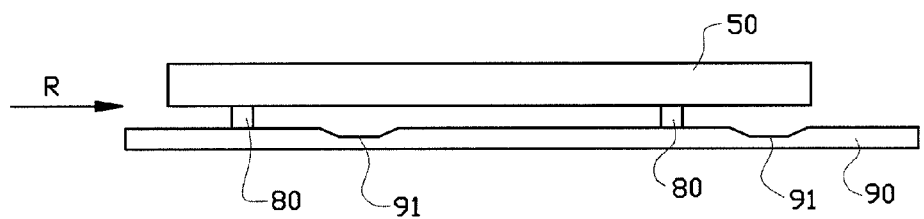
Figure 10B:
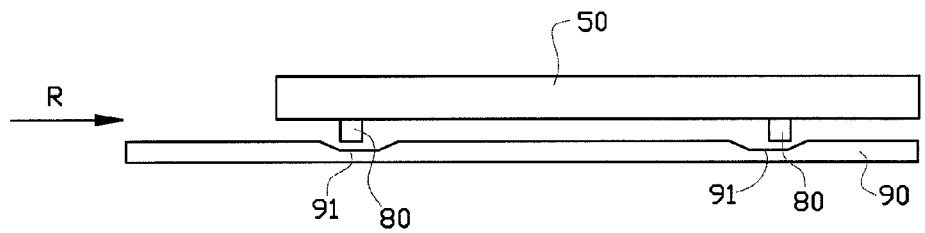

In a further exemplary embodiment as shown in FIG. 9, the module 50 is provided with slider pins 80 and the frame 70 is provided with rails 90. To make it easier to place a module 50 in the frame 70, the module 50 is supported on the rails 90 and can slide along the rails 90 in the insert direction R as shown in FIG. 10 A. It is noted that also the front guideway 69 of the frame 70 is provided with the rails 90.

A pair of rails 90 are arranged for supporting and guiding one module 50 during an insertion thereof in the assembly. When the module 50 has arrived at the required position, thus when the support members 51 are abutting the alignment surfaces 61 and are supported by the support surfaces 65, the module is no longer supported by the rails as shown in FIG. 10 B. In this required position of the module 50, the slider pins 80 are arranged above a cutout 91 of the rails 90.

Figure 11:
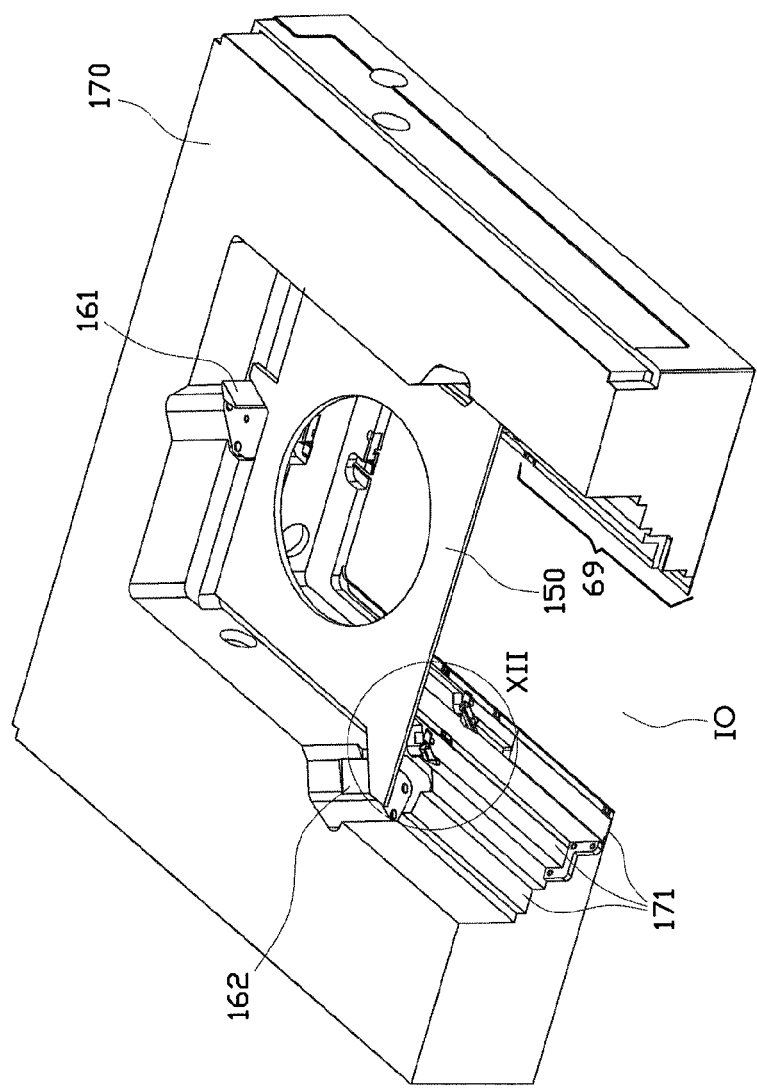
FIG. 11 shows a schematic view of a second example of a frame for arranging modules.
Figure 12:
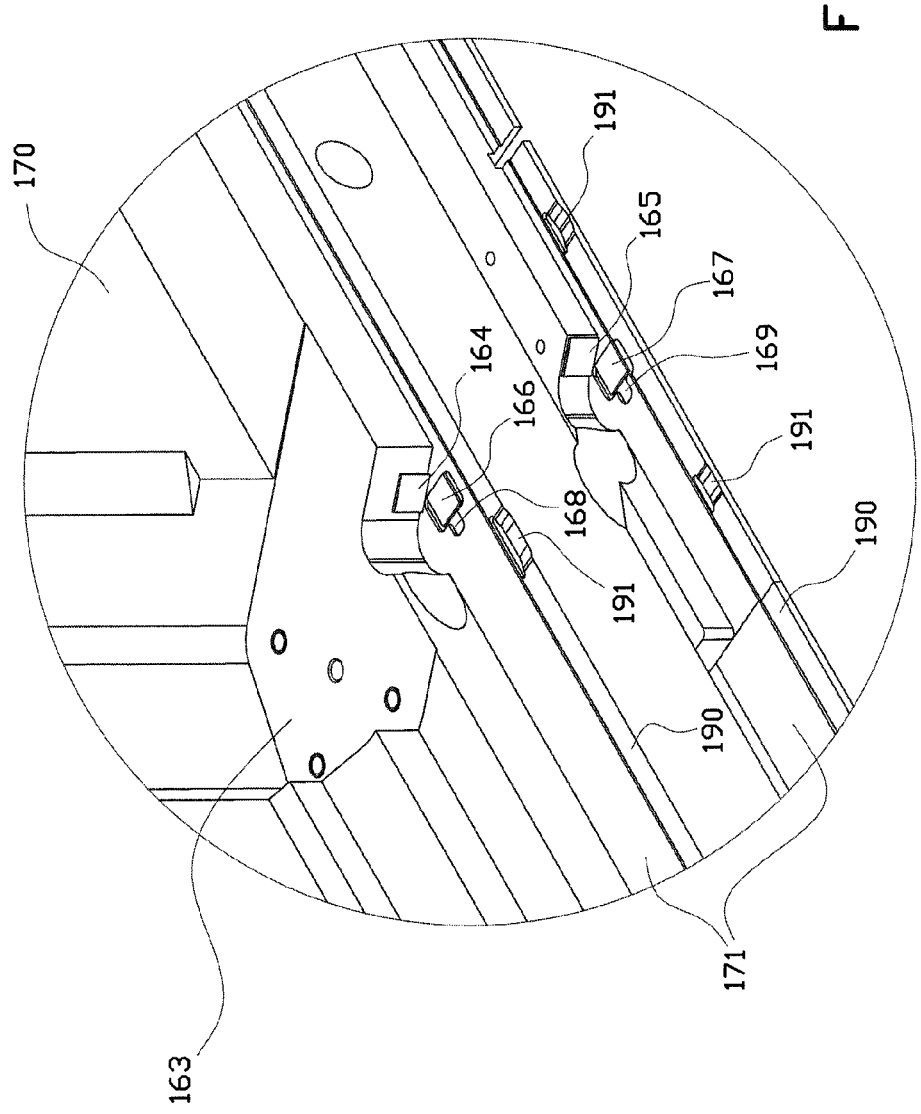
FIG. 12 shows a schematic view of the detail XII of the frame of FIG. 11.

FIG. 11 shows a further example of a frame 170 for the second exemplary embodiment as shown in FIG. 6. The frame 170 is substantially U-shaped, and is provided with inserts 161, 162 for the upper module 150, which inserts provide the alignment surfaces and the support surfaces. Each of the inserts 161, 162 comprises one alignment surface and one support surface, and is mounted on the frame at a mounting position 163 (see FIG. 12).

Contrarily to the example in FIG. 7, the alignment surfaces 164, 165 and the support surfaces 166, 167 for two lower modules are surfaces of individual alignment elements 164, 165, and individual support elements 166, 167. Each individual alignment elements 164, 165, and the individual support elements 166, 167 comprises, for example, a thin plate made from a hard material, such as such as titanium, and preferably the alignment surfaces are provided with a diamond like coating. Each of the thin plates is connect at the proper position to a precisely machined part of the frame 170. In this example, the individual support elements 166, 167 are arranged in a recess 168, 169.

The side-surfaces of the frame 170 is provided with stair-shaped recesses 171. At the edge of each recess 171 in the frame 170, a rail 190 is arranged for supporting and guiding a module during an insertion thereof in the assembly. The rail 190 is provided with cutouts 191 in order to establish that an inserted module is no longer supported by the rails 190 as shown explained above with reference to FIG. 10 B.

In summary, the invention relates to an assembly, preferably for use in a lithography system or a microscopy system, for providing an accurately aligned stack of two or more modules in a stacking direction. Each of the two or more modules comprises three support members. The assembly comprises a frame comprising three planar alignment surfaces which extend in the stacking direction and which are angularly off-set with respect to each other. In addition each of the three support members of each one of the two or more modules, when arranged in said frame, abuts against a corresponding one of the three alignment surfaces. The frame is provided with an opening between two of the three planar alignment surfaces for inserting a module in the assembly, said two planar alignment surfaces on either side of the opening are arranged at least partially facing said opening.

It is to be understood that the above description is included to illustrate the operation of the preferred embodiments and is not meant to limit the scope of the invention. From the above discussion, many variations will be apparent to one skilled in the art that would yet be encompassed by the spirit and scope of the present invention.

It is noted that for elucidating the invention, in the present examples reference is made to charged particle lithography system. However substantially the same setup for exposing a target with charged particles can also be used in a microscope, in particular an electron microscope.

In summary, the invention relates to an assembly, preferably for use in a lithography system or a microscopy system, for providing an accurately aligned stack of two or more modules in a stacking direction. Each of the two or more modules comprises three support members. The assembly comprises a frame comprising three planar alignment surfaces which extend in the stacking direction and which are angularly off-set with respect to each other. In addition each of the three support members of each one of the two or more modules, when arranged in said frame, abuts against a corresponding one of the three alignment surfaces. The frame is provided with an opening between two of the three planar alignment surfaces for inserting a module in the assembly, said two planar alignment surfaces on either side of the opening are arranged at least partially facing said opening.

The invention claimed is:

1. An assembly for providing an aligned stack of two or more modules in a stacking direction,
   wherein each of the two or more modules comprises three support members,
   wherein the assembly comprises a frame comprising three planar alignment surfaces for each of the two or more modules, which planar alignment surfaces extend in the stacking direction and which are angularly off-set with respect to each other,
   wherein each of the three support members of each one of the two or more modules, when arranged in said frame, abuts against a corresponding one of the three alignment surfaces, and
   wherein the frame is provided with an opening between two of the three planar alignment surfaces for inserting a module in the assembly, and wherein said two planar alignment surfaces on either side of the opening are arranged at least partially facing said opening.

2. The assembly according to claim 1, wherein for one of said two or more modules, each one of the three alignment surfaces extend in a corresponding plane, and wherein the corresponding planes of the three planar alignment surfaces intersect in an intersecting line, which intersecting line extends in the stacking direction.

3. The assembly according to claim 1, wherein for two or more modules all alignment surfaces extend in a corresponding plane, and wherein the corresponding planes of all alignment surfaces at least substantially intersect in one intersecting line, which intersecting line extends in the stacking direction.

4. The assembly according to claim 1, wherein the alignment surfaces for said two or more modules which are arranged at a same side of the opening are surfaces on a single alignment element.

5. The assembly according to claim 1, wherein the alignment surfaces for said two or more modules which are arranged at a same side of the opening are surfaces of individual alignment elements.

6. The assembly according to claim 1, further comprising a pre-load member for applying a force on at least one of the two or more modules for pushing the three support members of the at least one of the two or more modules against the corresponding one of the three alignment surfaces.

7. The assembly according to claim 1, wherein the frame comprises three support surfaces arranged in a first plane for supporting the support members of a first module of said two or more modules, and wherein the frame comprises three support surfaces arranged in a second plane for supporting the support members of a second module of said two or more modules, wherein the second plane is at least substantially parallel to the first plane.

8. The assembly according to claim 7, wherein the first and second plane extend at least substantially perpendicular to the stacking direction.

9. The assembly according to claim 7, wherein each of the three support surfaces for supporting the support members of a first module of said two or more modules are arranged adjacent to one of the three plane alignment surfaces.

10. The assembly according to claim 7, wherein the three support surfaces for supporting the support members of the second module of said two or more modules are arranged above the three support surfaces for supporting the support members of the first module.

11. The assembly according to claim 10, wherein the three support members of the second module are arranged at least substantially outside a triangle defined by support members of the first module.

12. The assembly according to claim 7, wherein the support surfaces for said two or more modules which are arranged at the same side of the opening are surfaces on a single support element.

13. The assembly according to claim 7, wherein the support surfaces for said two or more modules which are arranged at the same side of the opening are surfaces of individual support elements.

14. The assembly according to claim 1, wherein at least one of said support members of the two or more modules is a ball, preferably wherein each support member is a ball.

15. The assembly according to claim 1, wherein each of the three plane alignment surfaces is arranged in an at least substantially vertical plane, wherein said vertical planes intersect in an at least substantially vertical intersecting line which intersecting line defines the thermal centre of the aligned stack.

16. The assembly according to claim 1, wherein the assembly comprises rails for supporting and guiding at least one of the two or modules during an insertion thereof in the assembly, wherein the rails are arranged such that an inserted module is free from said rail.

17. The assembly according to claim 1, wherein each of the three planar alignment surfaces is arranged on a ridge.

18. The assembly according to claim 1, wherein the frame further comprises a front guideway for guiding one of the two or more modules when inserted in the assembly, wherein the front guideway extends from a position between the two of the three planar alignment surfaces in a direction facing away from the third planer alignment surface.

19. The assembly according to claim 18, wherein the assembly comprises a pre-load member, which in use is movably in the frame, in particular at the front guideway thereof, wherein the pre-load member is arranged for pushing the three support members of said one of the two or more modules against a corresponding one of the three planar alignment surfaces.

20. The assembly according to claim 19, wherein the pre-load member is arranged for, in use, delivering a force on one of the three support members of said one of the two or more modules for pushing all three support members of said one of the two or more modules against a corresponding one of the three planar alignment surfaces.

21. The assembly according to claim 19, wherein the frame is provided with a closing member which, at least when at least substantially arranged in a position for closing of an insert opening of the front guideway, pushes the pre-load member towards said one of the two or more modules.

22. The assembly according to claim 21, wherein the closing member comprises a spring.

23. The assembly according to claim 19, wherein the pre-load member is provided with wheels which are guided in the frame, to provide a substantially freely moving of the pre-load member along the front guideway.

24. A lithography system comprising an assembly according to claim 1.

25. The lithography system according to claim 24, comprising:
   a first module comprising a source for one or more charged particle beams,
   a second module comprising a deflector for said one or more charged particle beams, and
   a third module comprising a projection lens for projecting said one or more charged particle beams onto a target,
   wherein the first, second and third modules are inserted in the assembly to provide accurately aligned stack of said modules.

26. The lithography system according to claim 25, wherein the source, the deflector and the projection lens are arranged at least substantially at or near the thermal centre of the aligned stack.

27. A microscopy system comprising an assembly according to claim 1.

28. The microscopy system according to claim 27, comprising:
   a first module comprising a source for one or more electron beams,
   a second module comprising electron-optical elements for manipulating said one or more charged particle beams, and
   a third module comprising a projection lens for projecting said one or more charged particle beams onto a target,
   wherein the first, second and third modules are inserted in the assembly to provide accurately aligned stack of said modules.

* * * * *